(12) United States Patent
Wang

(10) Patent No.: US 12,364,136 B2
(45) Date of Patent: Jul. 15, 2025

(54) DISPLAY SUBSTRATE, DISPLAY DEVICE, AND MANUFACTURING METHOD

(71) Applicant: BOE Technology Group Co., Ltd., Beijing (CN)

(72) Inventor: Linlin Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 527 days.

(21) Appl. No.: 17/763,211

(22) PCT Filed: May 20, 2021

(86) PCT No.: PCT/CN2021/094946
§ 371 (c)(1),
(2) Date: Mar. 24, 2022

(87) PCT Pub. No.: WO2021/238772
PCT Pub. Date: Dec. 2, 2021

(65) Prior Publication Data
US 2022/0392980 A1 Dec. 8, 2022

(30) Foreign Application Priority Data

May 26, 2020 (CN) .......................... 202010455790.8

(51) Int. Cl.
*H10K 59/38* (2023.01)
*H10K 50/828* (2023.01)
(Continued)

(52) U.S. Cl.
CPC ........... *H10K 59/38* (2023.02); *H10K 50/828* (2023.02); *H10K 59/122* (2023.02); *H10K 71/00* (2023.02);
(Continued)

(58) Field of Classification Search
CPC .. H10K 59/122; H10K 71/00; H10K 59/1201; H10K 59/38; H10K 2102/331; H10K 50/828; G09F 9/301
See application file for complete search history.

(56) References Cited

U.S. PATENT DOCUMENTS 6,501,091 B1 * 12/2002 Bawendi ................ B82Y 10/00
257/14
9,385,345 B2 * 7/2016 Lee ....................... H10K 50/156
(Continued)

FOREIGN PATENT DOCUMENTS

| CN | 106935713 A | 7/2017 |
| CN | 108649057 A | 10/2018 |

(Continued)

OTHER PUBLICATIONS

International Search Report for PCT/CN2021/094946 Mailed Sep. 1, 2021.
(Continued)

*Primary Examiner* — Caleb E Henry
(74) *Attorney, Agent, or Firm* — Ling Wu; Stephen Yang; Ling and Yang Intellectual Property

(57) ABSTRACT

A display substrate, a display device, and a manufacturing method. The display substrate includes a TFT substrate, and a pixel defining layer provided on the TFT substrate and surrounding a plurality of pixel pits, wherein an electroluminescent device layer, a connection layer, a first encapsulation layer, and a quantum dot layer are sequentially stacked in each pixel pit; the connection layers in the adjacent pixel pits are connected to the side of the pixel defining layer facing away from the TFT substrate; and the connection layers are configured to be electrically connected to the electroluminescent device layers in the two adjacent pixel pits.

12 Claims, 2 Drawing Sheets

(51) Int. Cl.
*H10K 59/12* (2023.01)
*H10K 59/122* (2023.01)
*H10K 71/00* (2023.01)
*H10K 102/00* (2023.01)

(52) U.S. Cl.
CPC ... *H10K 59/1201* (2023.02); *H10K 2102/331* (2023.02)

(56) References Cited

U.S. PATENT DOCUMENTS

| | | | |
|---|---|---|---|
| 10,256,438 B2 * | 4/2019 | Kim | H10K 59/80524 |
| 10,825,871 B2 * | 11/2020 | Yun | H10K 59/8731 |
| 11,158,836 B2 * | 10/2021 | Lin | H10K 50/115 |
| 2009/0278450 A1 * | 11/2009 | Sonoyama | H10K 59/38 |
| | | | 313/504 |
| 2016/0351594 A1 * | 12/2016 | Shangguan | H10D 86/411 |
| 2017/0162821 A1 * | 6/2017 | Oh | H05K 1/028 |
| 2017/0186819 A1 * | 6/2017 | Yun | H10K 59/38 |
| 2018/0019428 A1 * | 1/2018 | Kawamura | H10K 50/13 |
| 2018/0122870 A1 * | 5/2018 | Park | H10K 50/11 |
| 2018/0211620 A1 | 7/2018 | Kurokawa et al. | |
| 2018/0324939 A1 * | 11/2018 | Wang | H05K 1/115 |
| 2018/0375058 A1 * | 12/2018 | Kawamura | H10K 50/13 |
| 2019/0019818 A1 * | 1/2019 | Huang | G02F 1/136259 |
| 2019/0074460 A1 * | 3/2019 | Cai | H10K 59/8722 |
| 2020/0258959 A1 | 8/2020 | Mao et al. | |
| 2021/0028255 A1 | 1/2021 | Gong et al. | |
| 2021/0098744 A1 | 4/2021 | Wang | |

FOREIGN PATENT DOCUMENTS

| | | |
|---|---|---|
| CN | 109300961 A | 2/2019 |
| CN | 109560117 A | 4/2019 |
| CN | 110379839 A | 10/2019 |
| CN | 110649185 A | 1/2020 |
| CN | 111584596 A | 8/2020 |

OTHER PUBLICATIONS

The First Office Action dated Sep. 18, 2021 for Chinese Patent Application No. 202010455790.8 and English Translation.
The Second Office Action dated Feb. 23, 2022 for Chinese Patent Application No. 202010455790.8 and English Translation.
The Decision of Rejection dated Jun. 16, 2022 for Chinese Patent Application No. 202010455790.8 and English Translation.

* cited by examiner

DISPLAY SUBSTRATE, DISPLAY DEVICE, AND MANUFACTURING METHOD

CROSS-REFERENCE TO RELATED APPLICATIONS

The present application is a U.S. National Phase Entry of International Application No. PCT/CN2021/094946 having an international filing date of May 20, 2021, which claims priority of Chinese patent application No. 202010455790.8, filed to CNIPA on May 26, 2020 and entitled "Display Substrate, Display Device, and Manufacturing Method", The above-identified applications are hereby incorporated by reference.

TECHNICAL FIELD

Embodiments of the present disclosure relate to, but not limited to the field of display device technologies, and particularly to a display substrate, a display device and a manufacturing method.

BACKGROUND

With the development of display technology, flexible Organic Light Emitting Diode (OLED) display products rapidly gained application and popularization, and Quantum Dots (QDs) are also used in flexible display products for their luminous characteristics. The current quantum dot display structure is achieved by two substrates being assembled into a cell, one of which is provided with traditional Thin Film Transistor (TFT) and electroluminescence (EL) structures, and the other is provided with quantum dot color filter, and then the two substrates are cell-assembled by colloid bonding to finally form the quantum dot display structure.

However, the method of the cell assembly requires high accuracy of the cell-assembly, and if a cell has large thickness, it can easily cause display defects such as light leakage. Moreover, the two substrates need to be bonded by colloid, which may absorb the blue light emitted by the EL structure, thus reducing the light emissivity and impacting on the display effect.

SUMMARY

The following is a summary for subject matters described herein in detail. The summary is not intended to limit the scope of protection of claims.

According to a first aspect, an embodiment of the present disclosure provides a display substrate, which includes:
a TFT substrate,
and a pixel define layer provided on the TFT substrate and forming a plurality of pixel pits;
wherein an electroluminescent device layer, a connection layer, a first encapsulation layer, and a quantum dot layer are sequentially stacked in each pixel pit; the connection layers in the adjacent pixel pits are connected on the side of the pixel define layer facing away from the TFT substrate; and the connection layers are configured to be electrically connected to the electroluminescent device layers in the two adjacent pixel pits.

Optionally, in the aforementioned display substrate, the size of the pixel define layer in a first direction is greater than or equal to the sum of the sizes of the electroluminescent device layer, the first encapsulation layer and the quantum dot layer in the first direction; and the first direction is the direction from the TFT substrate to the quantum dot layer.

Optionally, in the aforementioned display substrate, the pixel define layer is made of directional thermal expansion material.

Optionally, in the aforementioned display substrate, the pixel define layer expands to 10 um to 14 um in a direction facing away from the TFT substrate after laser irradiation.

Optionally, in the aforementioned display substrate, a color filter layer and a second encapsulation layer is further included;
the color filter layer is disposed on one side of the quantum dot layer and the connection layer facing away from the TFT substrate; wherein, the connection layer is exposed on one side of the pixel define layer facing away from the TFT substrate; and
the second encapsulation layer is disposed on one side of the color filter layer facing away from the TFT substrate.

Optionally, in the aforementioned display substrate, the quantum dot layer has a thickness greater than 10 um.

Optionally, in the aforementioned display substrate, the connection layer is made of metal material.

According to another aspect, an exemplary embodiment of the present disclosure further provides a display device, which includes the aforementioned display substrate described in any one of the foregoing.

According to another aspect, an embodiment of the present disclosure provides a manufacturing method for the display substrate based on the aforementioned display substrate, which includes the following steps:
preparing a TFT substrate;
preparing a pixel define layer on the TFT substrate and forming a plurality of pixel pits;
providing an electroluminescent device layer on one side of the pixel define layer facing away from the TFT substrate;
expanding the size of the pixel define layer in a first direction, wherein the first direction is the direction from the TFT substrate to the pixel define layer; and
sequentially stacking a connection layer, a first encapsulation layer and a quantum dot layer on the side of the electroluminescent device layer in each pixel pit facing away from the TFT substrate; and the connection layers in the adjacent pixel pits are connected on the side of the pixel define layer facing away from the TFT substrate.

Optionally, the expanding of the size of the pixel define layer in a first direction, wherein the first direction is the direction from the TFT substrate to the pixel define layer, comprises:
laser irradiating the electroluminescent device layer covered by the side of the pixel define layer facing away from the TFT substrate, eliminating the electroluminescent device layer covered by the side of the pixel define layer facing away from the TFT substrate, and expanding the pixel define layer to a preset size in the direction facing away from the TFT substrate.

Optionally, the pixel define layer is made of directional thermal expansion material.

Optionally, the preparing of a pixel define layer on the TFT substrate and forming a plurality of pixel pits, comprises:
providing the pixel define layer on the TFT substrate by ink jet printing.

Optionally, the aforementioned method further includes:
sequentially stacking a color filter layer and a second encapsulation layer on the side of the quantum dot layer facing away from the TFT substrate.

Optionally, the sequentially stacking of a color filter layer and a second encapsulation layer on the side of the quantum dot layer facing away from the TFT substrate, comprises:
preparing the color filter layer on the side of the quantum dot layer facing away from the TFT substrate by ink jet printing; and
preparing the second encapsulation layer on the side of the color filter layer facing away from the TFT substrate by any of the following methods: chemical vapor deposition, atomic layer deposition, magnetron sputtering and ink jet printing.

After the accompanying drawings and detailed descriptions are read and understood, other aspects may be understood.

DETAILED DESCRIPTION

In the following description, different occurrences of "one embodiment" or "an embodiment" do not necessarily refer to the same embodiment. In addition, specific features, structures, or characteristics in one or more embodiments may be combined in any suitable form.

Figure 1:
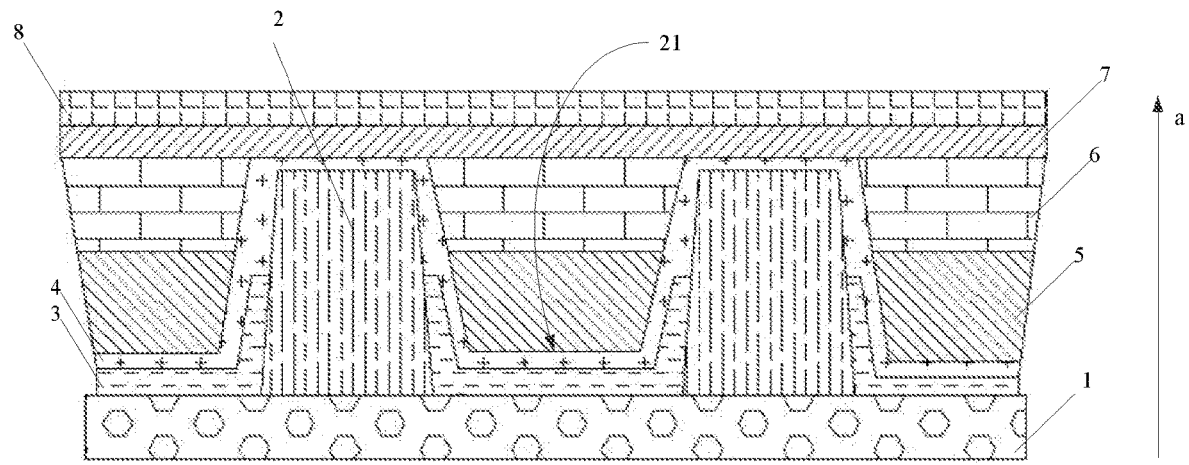
FIG. 1 is a schematic diagram of a structure of a display substrate according to an embodiment of the present disclosure.

Referring to FIG. 1, the display substrate provided by an embodiment of the present disclosure includes a TFT substrate 1, a pixel define layer 2, an electroluminescent device layer 3, a connection layer 4, a first encapsulation layer 5 and a quantum dot layer 6. The pixel define layer 2 is disposed on the TFT substrate 1 and forms a plurality of pixel pits 21.

In each pixel pit 21, an electroluminescent device layer 3, a connection layer 4, a first encapsulation layer 5 and a quantum dot layer 6 are stacked in sequence, and the connection layers 4 in the adjacent pixel pits 21 are connected at the side of the pixel define layer 2 away from the TFT substrate 1; and the connection layers 4 are configured to be electrically connected to the electroluminescent device layers 3 in the two adjacent pixel pits 21.

When quantum dots are applied to flexible OLED display devices, the conventional cell-assembly method can easily cause problems impacting display effect such as large cell thickness, light leakage, etc. An embodiment of the present disclosure provides a display substrate which can be improved for OLED display substrates. The display substrate includes the TFT substrate 1, the pixel define layer 2, the electroluminescent device layer 3, the connection layer 4, the first encapsulation layer 5 and the quantum dot layer 6. By arranging the quantum dot layer 6 and the electroluminescent device layer 3 on the same TFT substrate 1, and forming a plurality of pixels in a plurality of pixel pits 21, the integrated display substrate may be formed without cell assembly and without gluing. The thickness of the display substrate is thereby reduced, which reduces the blue light loss and prevents the problems of surface light leakage and uneven brightness.

In this embodiment, the quantum dot layer 6 functions as a color filter, which can convert the blue light emitted by OLED in the electroluminescent device layer 3 into green light or red light. Quantum Dots (QDs), also referred to as nanocrystals, are nanoparticles formed by II-VI group or III-V group elements. The particle diameter of quantum dots is generally between 1 nm and 20 nm. Because electrons and holes are confined by quantum, the continuous energy band structure becomes a discrete energy level structure, and the quantum can emit fluorescence after being excited. The emission spectrum of quantum dots may be controlled by changing the size of quantum dots, and the emission spectrum of quantum dots can cover the entire visible light region through changing the size and chemical composition of quantum dots. In this embodiment, the quantum dot layer 6 in part of the pixel pits 21 is configured to convert blue light emitted by OLED in the electroluminescent device layer 3 into green light; the quantum dot layer 6 in part of the pixel pits 21 is configured to convert blue light emitted by OLED in the electroluminescent device layer 3 into red light; and the quantum dot layer 6 in part of the pixel pits 21 is configured to keep the blue light emitted by OLED in the electroluminescent device layer 3 as blue light, thus forming a pixel layer with three primary colors. In order to ensure that the blue light emitted by the OLED in the electroluminescent device layer 3 can absorb enough quantum to emit green or red light, the thickness of the quantum dot layer 6 in this embodiment is configured to be greater than 10 um. The thickness of the quantum dot layer 6 may be set according to actual needs, which is not limited by the embodiment of the present disclosure.

Wherein, the TFT substrate 1 may be a thin film transistor substrate that provides signal driving and scanning signals to the electroluminescent device layer 3, and includes necessary structures such as gate electrode, source electrode and drain electrode.

Wherein, the pixel define layer 2 is disposed on the TFT substrate 1, and forms a plurality of pixel pits 21 to provide accommodation space for sub-pixels. In this embodiment, the pixel define layer 2 may be made of directional thermal expansion material, and is disposed on the TFT substrate 1 by ink jet printing to ensure that the pixel define layer 2 can expand vertically in the direction perpendicular to the TFT substrate 1 under heating conditions; that is, to increase the depth of the pixel pit 21 and provide enough accommodation space for the quantum dot layer 6 (the quantum dot layer 6 has larger thickness). Because the quantum dot layer 6 with a larger thickness is prepared by ink jet printing, it needs a thicker material of the pixel define layer 2 to limit the flow of quantum dot ink. Here, the depth direction of the pixel pit 21 and the thickness direction of the quantum dot layer 6 are the same, which is the first direction a as shown by the arrow in FIG. 1. In a manufacturing process of a high-thickness pixel define layer, when the pixel define layer is too thick, problems of underexposure may occur, which causes photoresist residues in pixels on one side of the color filter substrate, thereby affecting the spread of quantum dot ink, which eventually affects the stability of quantum dot film formation. In the embodiment of the present disclosure, the pixel define layer 2 is set as a directional thermal expansion material, and the above problem can be overcome by the anisotropy of material automatic expansion.

Figure 3:
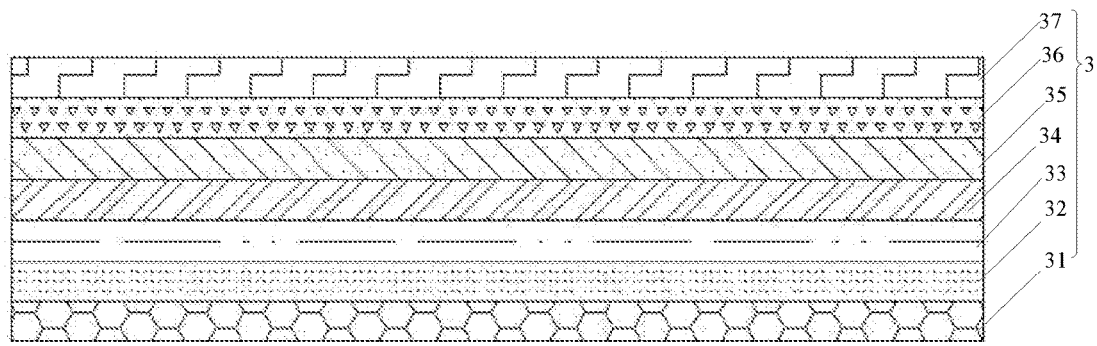
FIG. 3 is a schematic diagram of a structure of an electroluminescent device layer of the display substrate according to an embodiment of the present disclosure.

Referring to FIG. 3, the electroluminescent device layer 3 includes an anode layer 31, an electron injection layer 32, an electron transport layer 33, a light emitting layer 34, a hole transport layer 35, a hole injection layer 36 and a cathode layer 37 which are sequentially stacked.

Wherein, the connection layer 4 is made of metal material, such as indium zinc oxide (IZO) which is a rotating target material. Because the corresponding part of the electroluminescent device layer 3 and the pixel define layer 2 is interrupted, the cathode layers 37 of the electroluminescent device layers 3 in the adjacent pixel pits 21 cannot be electrically connected. Furthermore, in this embodiment, the connection layer 4 is disposed on one side of the electroluminescent device layer 3 facing away from the TFT substrate 1, and make sure that the connection layers 4 in the adjacent pixel pits 21 are mutually connected at the side of the pixel define layer 2 facing away from the TFT substrate 1, so that the cathode layers 37 of the electroluminescent device layers 3 in the adjacent pixel pits 21 are electrically connected with each other to ensure the regular operation of the electroluminescent device layers 3.

Wherein, the first encapsulation layer 5 may be made of common encapsulation materials, which will not be repeated here. In this embodiment, the first encapsulation layer 5 is used to protect the electroluminescent device layer 3.

According to the above, in the display substrate provided by the embodiment of the present disclosure, the quantum dot layer 6 and the electroluminescent device layer 3 are disposed on the same TFT substrate 1, which achieves the integrated arrangement of the display substrate, cell assembly or gluing are not required, and the thickness of the display substrate is thereby reduced, which reduces the blue light loss and prevents the problems of surface light leakage and uneven brightness. In the display substrate provided by the embodiment of the present disclosure, the pixel define layer 2 serves as the defining layer of the quantum dot layer 6 and the electroluminescent device layer 3 (i.e., the pixel define layer 2 in the display substrate serves as both the defining layer of the quantum dot layer 6 and the defining layer of the electroluminescent device layer 3), which is conducive to the development of flexible display devices.

Herein, the term "and/or" is only an association relationship describing associated objects, which means that there may be three relationships, for example, A and/or B, which is understood as: A and B may be included, A may exist alone or B may exist alone, and there may be any of the above three situations.

Figure 2:
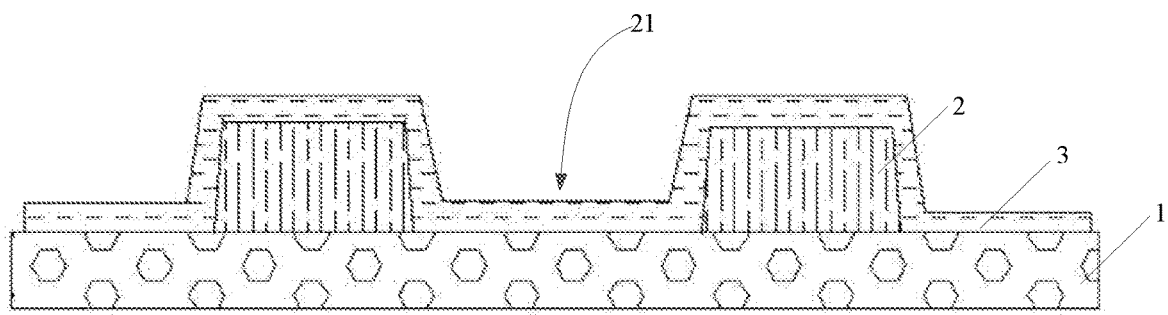
FIG. 2 is a schematic diagram of a partial structure of a display substrate according to an embodiment of the present disclosure.

Optionally, referring to FIG. 1 and FIG. 2, an embodiment of the present disclosure provides a display substrate, in which the size of the pixel define layer 2 in a first direction a is greater than or equal to the sum of the sizes of the electroluminescent device layer 3, the first encapsulation layer 5 and the quantum dot layer 6 in the first direction a; and the first direction a is the direction from the TFT substrate 1 to the quantum dot layer 6.

Optionally, in order to have the pixel define layer 2 to serve as the defining layer of the electroluminescent device layer 3 and the quantum dot layer 6, in this embodiment, the size of the pixel define layer 2 in the first direction a (that is, the direction perpendicular to the TFT substrate 1 and facing away from the TFT substrate 1) is greater than or equal to the sum of the sizes of the electroluminescent device layer 3, the first encapsulation layer 5 and the quantum dot layer 6 in the first direction A, so that both the electroluminescent device layer 3 and the quantum dot layer 6 can be accommodated in the same pixel pit 21. Optionally, in this embodiment, each pixel pit 21 needs to be able to accommodate the electroluminescent device layer 3, the connection layer 4, the first encapsulation layer 5 and the quantum dot layer 6. The connection layer 4 will make the depth of the pixel pit 21 increased at the side of the pixel define layer 2 facing away from the TFT substrate 1, so when designing the thickness of the pixel define layer 2, it is unnecessary to consider the thickness of the connection layer 4. However, the thicknesses of the electroluminescent device layer 3, the first encapsulation layer 5 and the quantum dot layer 6 can be clearly defined in the design, so when selecting the material of the pixel define layer 2, the material that can expand to the preset size can be selected as required.

Optionally, an embodiment of the disclosure provides a display substrate. In actual implementation, the pixel define layer 2 is made of directional thermal expansion material.

Optionally, when a material with directional thermal expansion properties is selected as the material for the pixel define layer 2, such as a composite material of aramid fiber and flexible resin, good adhesion between aramid fiber and flexible resin increases the stability of the composite material of aramid fiber and flexible resin during thermal expansion. In this embodiment, when the pixel define layer 2 is initially provided, the thickness of the pixel define layer 2 may be set to 2 um to 3 um according to industry experience or convention, and then after the electroluminescent device layer 3 on the pixel define layer 2 is eliminated by ultraviolet laser (UV laser) (the laser can not only eliminate the electroluminescent device layer 3 but also provide heat needed for the expansion of the pixel define layer 2), the pixel define layer 2 is heated and expanded to the height required by the design with the help of the heat of the ultraviolet laser, for example, 10 um to 14 um, which is not limited here and may be adjusted according to actual needs. The adjustment method may be, for example, adjusting the heat emitted by the ultraviolet laser or adjusting the thickness of the pixel define layer 2 initially provided, which will not be repeated here. In this embodiment, the material of the pixel define layer 2 is selected as a material with directional thermal expansion property, which also defines that some common photolithography methods in the technology cannot be used in the initial stage of preparing the pixel define layer 2. Because the photolithography method will inevitably emit heat, which will cause the expansion of the pixel define layer 2 at the initial stage of preparing the pixel define layer 2, and the thickness of the pixel define layer 2 cannot be changed after the electroluminescent device layer 3 is provided. Furthermore, in this embodiment, the preparation mode of the pixel define layer 2 is designed as an ink jet printing mode, and in other embodiments, the preparation mode of the pixel define layer 2 may be selected according to requirements, which is not limited in this embodiment.

Optionally, referring to FIG. 1, a display substrate provided by this embodiment further comprises a color filter layer 7 and a second encapsulation layer 8;

the color filter layer 7 is disposed on one side of the quantum dot layer 6 and the connection layer 4 facing away from the TFT substrate 1; wherein, the connection layer 4 is exposed on one side of the pixel define layer 2 facing away from the TFT substrate 1; and the second encapsulation layer 8 is disposed on one side of the color filter layer 7 facing away from the TFT substrate 1.

Optionally, in order to avoid that the blue light emitted by the OLED in the electroluminescent device layer 3 is not completely converted after passing through the quantum dots 6, which results in impure green or red light emitted, in this embodiment, a Color Filter (CF) layer 7 is provided on the side of the quantum dot layer 6 facing away from the TFT substrate 1 to purify the light emitted by the sub-pixels in each pixel pit 21.

Optionally, in order to protect the integrated display substrate, in this embodiment, a second encapsulation layer 8 is provided on the side of the color filter layer 7 facing away from the TFT substrate 1, which is used to form the final encapsulation structure of the display substrate, and ensure the sealing and safety of the integrated display substrate. The second encapsulation layer 8 is made of common encapsulation material in some technologies and will not be described in detail here.

An embodiment of the present disclosure further provides a display device which includes the display substrate in any one of the aforementioned embodiments.

The display substrate in this embodiment can directly adopt the display substrate described in Embodiment 1. Please refer to the above-mentioned embodiment for detailed structure.

Figure 4:
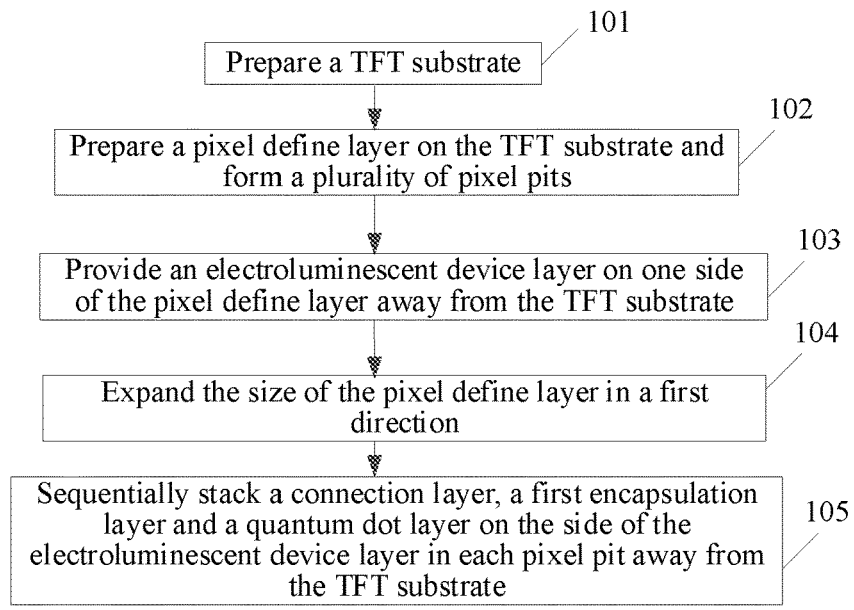
FIG. 4 is a schematic flowchart of a method for manufacturing a display substrate according to an embodiment of the present disclosure.

Referring to FIG. 4, an embodiment of the present disclosure provides a method for manufacturing a display substrate according to embodiment 1, which includes the following acts:

in Act 101, a TFT substrate 1 is prepared;
for example, a Thin Film Transistor (TFT) circuits is prepared on the substrate.

In Act 102, a pixel define layer 2 is prepared on the TFT substrate 1 and multiple pixel pits 21 are formed.

Optionally, the directional thermal expansion material is selected for the pixel define layer 2, and the pixel define layer 2 is prepared on the TFT substrate 1 by ink jet printing, and several pixel pits 21 are formed.

In Act 103, an electroluminescent device layer 3 is provided on one side of the pixel define layer 2 facing away from the TFT substrate 1.

Optionally, the electroluminescent device layer 3 is manufactured by evaporation, which includes configuring the cathode layer 37 of the electroluminescent device layer 3 as a semitransparent and semireflecting electrode layer by evaporation.

In Act 104, the size of the pixel define layer 2 is expanded in a first direction a, wherein the first direction a is the direction from the TFT substrate 1 to the pixel define layer 2.

Optionally, the electroluminescent device layer 3 on the upper side of the pixel define layer 2 is removed to expand the pixel define layer 2, so that the depth of the pixel pit 21 is increased to accommodate the electroluminescent device layer 3, the connection layer 4, the first encapsulation layer 5 and the quantum dot layer 6. Herein, a material with directional thermal expansion properties is selected for the pixel define layer 2, such as a composite material of aramid fiber and flexible resin.

In Act 105, a connection layer 4, a first encapsulation layer 5 and a quantum dot layer 6 are sequentially stacked on the side of the electroluminescent device layer 3 in each pixel pit 21 away from the TFT substrate 1; and the connection layers 4 in the adjacent pixel pits 21 are connected on the side of the pixel define layer 2 facing away from the TFT substrate 1.

Optionally, the connection layer 4 (the connection layer 4 is made of metal material, such as indium tin oxide IZO) is prepared on the side of the electroluminescent device 3 facing away from the TFT substrate 1 by sputtering, so that the connection layer 4 covers the electroluminescent device layer 3 and the pixel define layer 2, which achieved the electrical connection between the cathode layers 37 of the electroluminescent device layers 3 in adjacent pixel pits 21. Then, the first encapsulation layer 5 is prepared by Chemical Vapor Deposition (CVD), Atomic Layer Deposition (ALD), magnetron sputter or Ink Jet Printing (IJP). Finally, the quantum dot layer 6 is prepared by ink jet printing.

Figure 5:
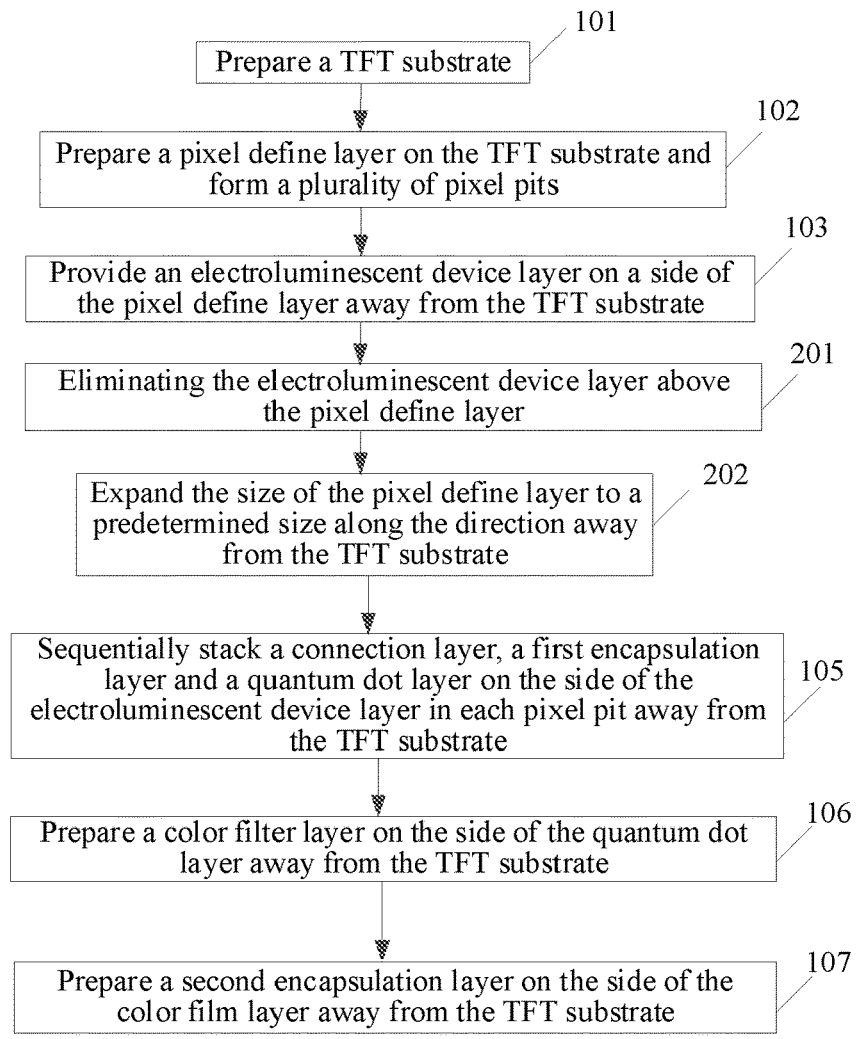
FIG. 5 is a schematic detailed flowchart of a method for manufacturing a display substrate according to an embodiment of the present disclosure.

Optionally, referring to FIG. 5, in this embodiment, the above Act 104 may be the following acts:

in Act 201, the electroluminescent device layer 3 above the pixel define layer 2 is eliminated.

Optionally, the electroluminescent device layer 3 covered by the side of the pixel define layer 2 facing away from the TFT substrate 1 is irradiated by laser (ultraviolet laser, UV).

In Act 202, the size of the pixel define layer 2 is expanded to a preset size in the direction facing away from the TFT substrate 1.

Optionally, when laser irradiates the electroluminescent device layer 3, the pixel define layer 2 absorbs the heat and expands in a longitudinal direction. During this period, the pixel define layer 2 may be controlled to expand to a thickness sufficient to define the quantum dot layer 6 and the electroluminescent device layer 3, for example, 10 um to 14 um by controlling the heat of laser, irradiation time, thickness of the original pixel define layer 2 and other factors.

Optionally, referring to FIG. 5, in this embodiment, after Act 105, the above manufacturing method further comprises:

Act 106, a color filter layer is prepared on the side of the quantum dot layer 6 facing away from the TFT substrate 1 by ink jet printing.

In Act 107, the second encapsulation layer 8 is prepared by Chemical Vapor Deposition (CVD), Atomic Layer Deposition (ALD), magnetron sputter or Ink Jet Printing (IJP) on the side of the color filter layer 7 facing away from the TFT substrate 1.

The above are merely preferred exemplary embodiments of the present disclosure, which are not intended to limit the present disclosure in any form. Therefore, the above embodiments may be combined. Any simple amendment, equivalent variation and modification made to the above embodiments according to the technical substance of the present disclosure shall be covered by the scope of the technical solutions of the present disclosure.

The invention claimed is:
1. A display substrate, comprising:
a TFT substrate; and
a pixel define layer provided on the TFT substrate and forming a plurality of pixel pits,
wherein an electroluminescent device layer, a connection layer, a first encapsulation layer, and a quantum dot layer are sequentially stacked in each pixel pit; connection layers in adjacent pixel pits are connected on a side of the pixel define layer away from the TFT substrate; and the connection layers are arranged to be electrically connected to electroluminescent device layers in two of the adjacent pixel pits,
wherein the pixel define layer is made of directional thermal expansion material, and
wherein the pixel define layer expands to 10 um to 14 um in a direction away from the TFT substrate after laser irradiation.

2. The display substrate of claim 1, wherein
a size of the pixel define layer in a first direction is greater than or equal to a sum of sizes of the electroluminescent device layer, the first encapsulation layer and the quantum dot layer in the first direction; and
the first direction is a direction from the TFT substrate to the quantum dot layer.

3. A display device, comprising:
the display substrate according to claim 2.

4. The display substrate of claim 1, wherein
the quantum dot layer has a thickness greater than 10 um.

5. The display substrate of claim 1, wherein
the connection layer is made of metal material.

6. A display device, comprising:
the display substrate according to claim 1.

7. A manufacturing method for the display substrate according to claim 1, comprising:
preparing the TFT substrate;
preparing the pixel define layer on the TFT substrate and forming the plurality of pixel pits;
arranging the electroluminescent device layer on the side of the pixel define layer away from the TFT substrate;
expanding a size of the pixel define layer in a first direction, wherein the first direction is a direction from the TFT substrate to the pixel define layer; and
sequentially stacking the connection layer, the first encapsulation layer and the quantum dot layer on a side of the electroluminescent device layer in each pixel pit away from the TFT substrate; and the connection layers in the adjacent pixel pits are connected on the side of the pixel define layer away from the TFT substrate.

8. The manufacturing method for the display substrate of claim 7, wherein expanding the size of the pixel define layer in the first direction, wherein the first direction is the direction from the TFT substrate to the pixel define layer, comprises:
laser irradiating the electroluminescent device layer covered by the side of the pixel define layer away from the TFT substrate, eliminating the electroluminescent device layer covered by the side of the pixel define layer away from the TFT substrate, and expanding the pixel define layer to a preset size in the direction away from the TFT substrate.

9. The manufacturing method for the display substrate of claim 8,
wherein preparing the pixel define layer on the TFT substrate and forming the plurality of pixel pits, comprises:
arranging the pixel define layer on the TFT substrate by ink jet printing.

10. The manufacturing method for claim 7, further comprising:
sequentially stacking a color filter layer and a second encapsulation layer on a side of the quantum dot layer away from the TFT substrate.

11. The manufacturing method for the display substrate of claim 10, wherein sequentially stacking the color filter layer and the second encapsulation layer on the side of the quantum dot layer facing away from the TFT substrate, comprises:
preparing the color filter layer on the side of the quantum dot layer away from the TFT substrate by ink jet printing; and
preparing the second encapsulation layer on a side of the color filter layer away from the TFT substrate by any of the following methods: chemical vapor deposition, atomic layer deposition, magnetron sputtering and ink jet printing.

12. A display substrate, comprising:
a TFT substrate; and
a pixel define layer provided on the TFT substrate and forming a plurality of pixel pits,
wherein an electroluminescent device layer, a connection layer, a first encapsulation layer, and a quantum dot layer are sequentially stacked in each pixel pit; connection layers in adjacent pixel pits are connected on a side of the pixel define layer away from the TFT substrate; and the connection layers are arranged to be electrically connected to electroluminescent device layers in two of the adjacent pixel pits,
wherein the pixel define layer is made of directional thermal expansion material,
wherein the display substrate further comprises a color filter layer and a second encapsulation layer,
wherein the color filter layer is disposed on a side of the quantum dot layer and the connection layer away from the TFT substrate; wherein, the connection layer is exposed on the side of the pixel define layer away from the TFT substrate, and
wherein the second encapsulation layer is disposed on a side of the color filter layer away from the TFT substrate.

* * * * *

UNITED STATES PATENT AND TRADEMARK OFFICE
CERTIFICATE OF CORRECTION

PATENT NO. : 12,364,136 B2  
APPLICATION NO. : 17/763211  
DATED : July 15, 2025  
INVENTOR(S) : Linlin Wang Page 1 of 1

It is certified that error appears in the above-identified patent and that said Letters Patent is hereby corrected as shown below:

On the Title Page

Item (54), and in the Specification, Column 1, Lines 1-2, should read as follows:
Organic Light Emitting Diode Display Substrate, Organic Light Emitting Diode Display Device, and Manufacturing Method Signed and Sealed this
Nineteenth Day of August, 2025

Coke Morgan Stewart
*Acting Director of the United States Patent and Trademark Office*